United States Patent [19]

Morgan et al.

[11] Patent Number: 4,967,146
[45] Date of Patent: Oct. 30, 1990

[54] SEMICONDUCTOR CHIP PRODUCTION AND TESTING PROCESSES

[75] Inventors: Peter J. Morgan, Allen; Robert O. Miller, The Colony, both of Tex.

[73] Assignee: Rockwell International Corporation, El Segundo, Calif.

[21] Appl. No.: 351,638

[22] Filed: May 15, 1989

[51] Int. Cl.⁵ .............................................. G01R 31/00
[52] U.S. Cl. ..................... 324/158 R; 324/158 D; 324/158 T; 357/55; 437/8
[58] Field of Search ........... 324/158 R, 158 D, 158 F, 324/158 T; 357/55; 437/8; 371/28, 22-23

[56] References Cited

U.S. PATENT DOCUMENTS

| | | | |
|---|---|---|---|
| 3,436,605 | 4/1969 | Landron, Jr. | 357/55 |
| 3,644,801 | 2/1972 | Sheldon | 357/55 |
| 3,878,552 | 4/1975 | Rodgers | 357/55 |
| 3,984,860 | 10/1976 | Logue | 437/8 |
| 4,046,605 | 9/1977 | Nelson et al. | 357/55 |
| 4,281,449 | 8/1981 | Ports et al. | 324/158 R |
| 4,295,182 | 10/1981 | Aubusson et al. | 437/8 |
| 4,428,111 | 1/1984 | Swartz | 357/56 |
| 4,489,477 | 12/1984 | Chik et al. | 437/8 |
| 4,498,229 | 2/1985 | Wilner | 357/55 |
| 4,523,964 | 6/1985 | Wilner et al. | 357/55 |
| 4,799,009 | 1/1989 | Tada et al. | 324/158 F |
| 4,855,253 | 8/1989 | Weber | 324/158 R |

Primary Examiner—Ernest F. Karlsen
Assistant Examiner—William J. Burns
Attorney, Agent, or Firm—Bruce C. Lutz; V. Lawrence Sewell; H. Fredrick Hamann

[57] ABSTRACT

Precisely controlled grooves are formed in a semiconductor wafer as part of a total photolithographic process of producing the circuitry and the V-grooves for precise registration of the circuitry relative the edges of the individual chips of the wafer. The same registration facilitates automated electrical testing of each of the chip circuits on the wafer prior to the controlled disassembly of the array of chips into individual die. The design of the electrical connections on the array before disassociation into individual die also facilitates a mass burn-in of the circuits which burn-in tends to identify and eliminate parts subject to early failure.

7 Claims, 3 Drawing Sheets

SEMICONDUCTOR CHIP PRODUCTION AND TESTING PROCESSES

THE INVENTION

The present invention is generally concerned with the production of semiconductor heat sink type chips from a semiconductor wafer. It is more specifically concerned with the accurate registration and alignment of semiconductor parts on each chip with respect to the edge of the chip after disassembly of the wafer into individual die. Even more specifically, the present invention is related to the use of photolithographic techniques to form both etched V-grooves which constitute the basis of fracture lines on the wafer used to generate the individual die and circuit paths to facilitate burn-in and testing of circuitry on the chips and to facilitate final assembly of the tested chip.

BACKGROUND

In the prior art it has been a common practice to provide burn-in testing of a laser diode before final assembly into a finished product. The reason for this is that it has been found that a large majority of "near-term" failures of electronic equipment occur within the first few hours of operation. To prevent destruction of the laser diodes during the burn-in process (and in later "normal" operation), it is necessary that the heat generated in the laser action be dissipated in some type of heat sink. To facilitate positioning (focusing) of the laser diode in a finished product, it is desirable that the diode be accurately aligned or positioned with respect to the edges of the heat sink base. While this can be accomplished in a manual operation, it can be very time consuming. Further, it is desirable to test the laser diode to make sure that its characteristics fall within prescribed ranges before using it in an assembled product. Since an individual chip is very small and somewhat fragile, it is very time consuming to accomplish the parameter testing prior to final assembly. Discovery that the chip does not meet specified requirements at this stage results in the disposal of the finished product as waste.

The problems outlined above have been solved by the present inventive concept which involves the production of a plurality of semiconductor chips usable as heat sinks defined on a semiconductor wafer through a photolithographic process. As long as the wafer has a crystalline structure which causes the surfaces to be <100> orientated, a pattern of V-grooves can be etched into the surface wherein the vertices follow the <110> crystallographic planes of the semiconductor wafer and at the proper point in manufacture, the array of heat sink chips can be disassembled into individual chips by fracturing the wafer chips along the V-grooves. Since the circuitry on the heat sinks has been photolithographically defined using the same process as that used to define the V-grooves, the edges of the individual chips are accurately registered with respect to the circuitry. Individual laser diodes can be accurately positioned on a given circuit path on a wafer using mechanical automated procedures and solder reflow techniques. With the proper design of the electronic circuitry on the wafer, a large plurality of chips and their associated laser diodes can be serially interconnected to perform mass burn-in of the diodes. If the photolithographic techniques are used to identify each of the specific chips on a wafer, not only can automated techniques be used to test the individual chips in the array for operability and characteristic range compliance, but the parts failing to pass test requirements can be readily identified and disposed of prior to assembly of the remaining parts in a finished product.

It is thus an object of the present invention to reduce the cost of producing a finished product incorporating a laser diode on a heat sink.

Other objects and advantages of the present invention will be apparent from a reading of the specification and appended claims in conjunction with the drawings wherein:

DETAILED DESCRIPTION

Figure 1:
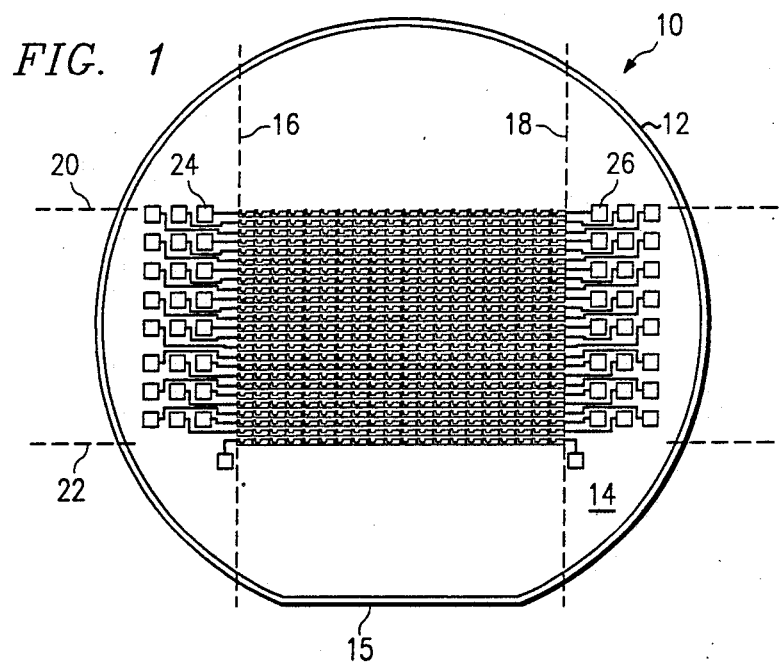
FIG. 1 is an illustration of a wafer containing an array of heat sink chips to be tested and disassembled into individual die.

In FIG. 1 a wafer generally illustrated as 10 is shown. A wafer as typically used in the present invention in the preferred embodiment comprises silicon as represented by the larger outside circle 12. A layer of insulating material such as a thermal oxide is represented by the slightly smaller circle and is designated as 14. The oxide 14 typically covers both sides of the silicon base. A flat portion 15 of the wafer is used as an industry standard and provides a reference to the orientation of the crystalline structure of the wafer. Through photolithographic techniques, an array of circuits is shown in the center part of wafer 10 and these circuits are deposited in the form of one or more conductive materials such as gold on the oxide surface 14. A pair of dash lines 16 and 18 define the width of the array while a pair of dash lines 20 and 22 define the height of the array. To the left and right of lines 16 and 18 are a plurality of contacts, one of which is labeled as 24 on the lefthand side and one of the contacts on the righthand side is labeled as 26. The designators 24 and 26 are representative of any of the contacts on that portion of the wafer for purposes of later discussion. One embodiment of the invention incorporated 25 rows of circuits with each row containing 20 separate circuits which initially were all connected in series between the end contacts such as 24 and 26.

Figure 2:
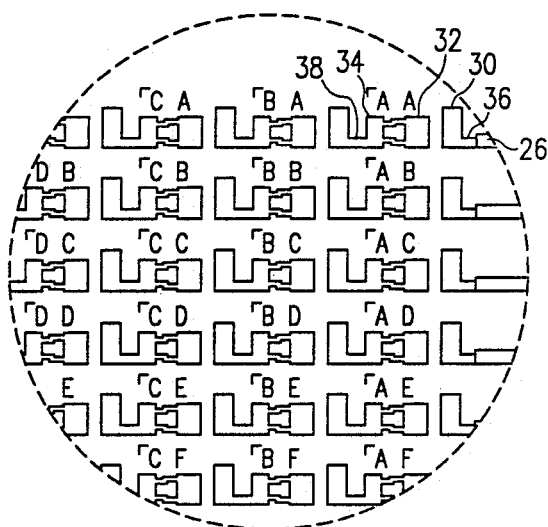
FIG. 2 is an enlarged portion of the array of FIG. 1.
Figure 3:
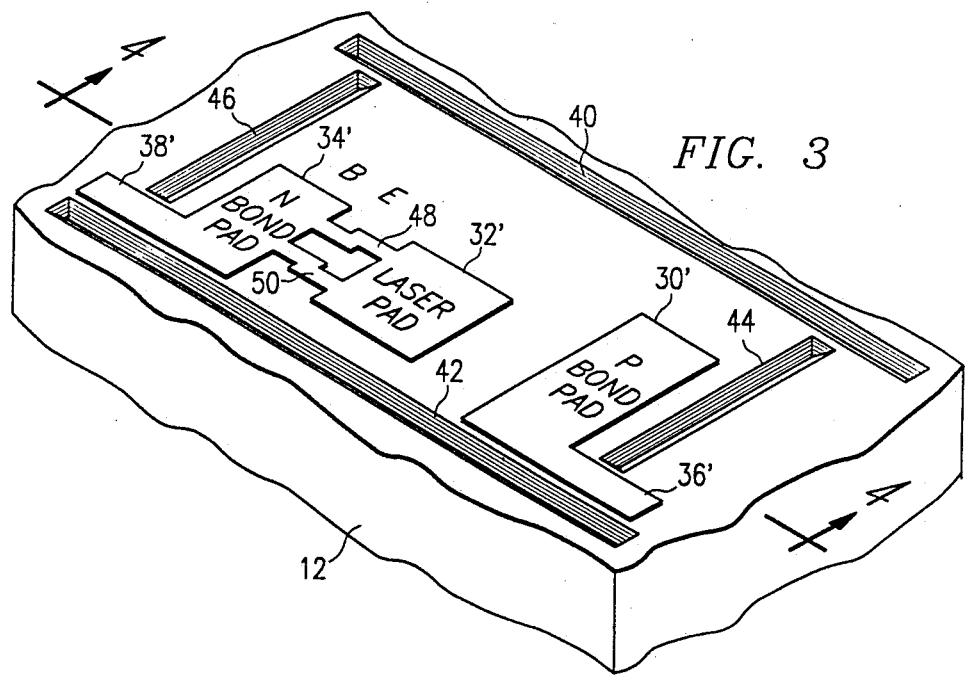
FIG. 3 is a detailed perspective illustration of a specific die such as BE of FIG. 2.

In FIG. 2 an enlarged portion of the upper righthand corner of the array of FIG. 1 is illustrated. It will be noted that each circuit is given a letter designator with the first letter being used to designate the position in the series circuit and the second letter being used to designate the horizontal row in the array. Thus, circuit AA has a righthand portion 30 used as a bond pad, a central portion 32 used to position and attach a laser diode and a further bond pad 34 in the lefthand portion. A lead 36 connects to a portion of righthand contact 26 and a lead 38 is used to provide an electrical connection to the circuit BA on the left. Each of the remaining circuits through row Y on the bottom are substantially identical to circuit AA. In FIG. 3 primes (i.e., 32') have been added to parts that are comparable to that of FIG. 2.

Although FIG. 3 illustrates that it is representative of circuit BE, circuit BE was illustrated to more clearly represent the groove pattern which is etched into the surface of the wafer 10 through the oxide 14 and into the substrate 12. In FIG. 3, horizontal grooves 40 and 42 are illustrated along with vertical grooves 44 and 46. In addition, connection paths 48 and 50 are designated for completeness of describing FIG. 3. As will be noted, the grooves 44 and 46 do not extend quite to the edge of groove 40 and also stop somewhat short of the conductive paths 36' and 38'. If the etched pattern used to define the grooves allowed the intersection of the horizontal and vertical grooves, the edges of the resulting die would tend to be rounded off or otherwise irregular. Thus, the grooves merely define a fracture line and in association with the proper orientation of the crystalline structure results in a straight line fracture through areas such as the conducting paths 36' and 38'.

Figure 4:
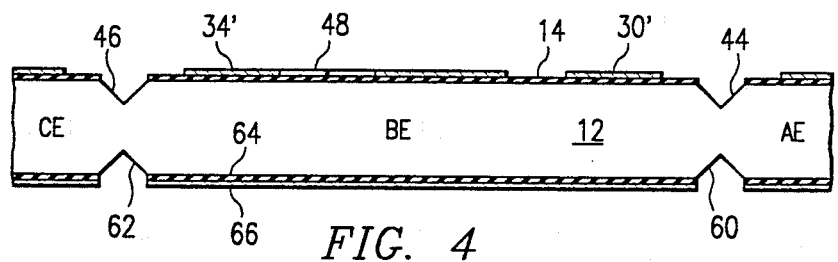
FIG. 4 is a cross-sectional view of the die of FIG. 3.

Although the grooves 44 and 46, as shown, provide enough definition of the fracture line to perform a satisfactory break in a majority of applications, a preferred embodiment of the invention contains fracture-defining grooves on the opposite side of the wafer. In FIG. 4, the grooves 60 and 62 are shown with an oxide layer on the back being designated as 64 and a metallic layer shown as 66. As illustrated, the groove 60 is exactly opposite groove 44 and groove 62 is exactly opposite 46. There would be similar grooves corresponding to 40 and 42 on the reverse side of the wafer 10.

Figure 5:
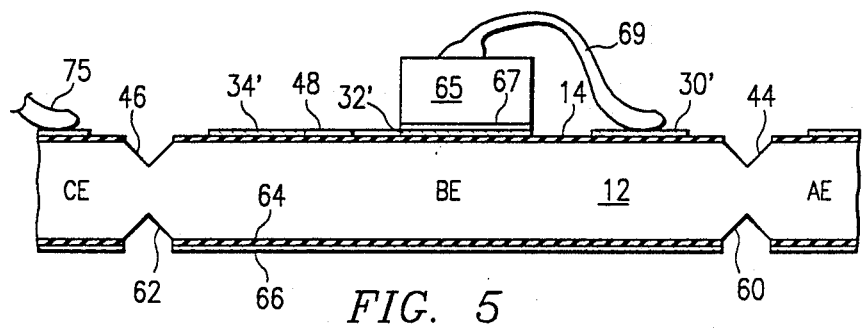
FIG. 5 is a view of FIG. 4 with a laser diode attached to the heat sink chip and an electrical connection provided for later use in burn-in testing and final assembly.

In FIG. 5, the same numbers are used as were used in FIG. 4 where appropriate. In addition to the parts shown in FIG. 4, there is a laser diode generally designated as 65 attached through a layer of solder 67 to the laser pad 32'. A lead 69 is shown connecting the top of laser diode 65 to the bond pad 30'. The end of wire 69 as connected to diode 65 is shown in the form of a ball bond whereas the bond at the end connected to pad 30' is an edge-type or stitch bond. A further lead 75 is shown on the lefthand edge of FIG. 5 for connecting the bond pad underneath to the next adjacent laser diode.

Figure 6:
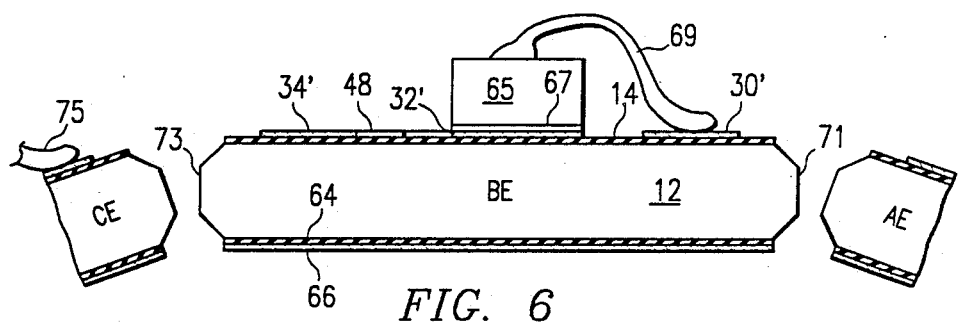
FIG. 6 illustrates the fracturing process along the V-grooves to disassemble the array into individual die.

The view of FIGS. 4 and 6 are as shown in FIG. 3 across cutaway view 4—4, however, there would be an electrical and mechanical connection between bond pad 30' and the next adjacent bond pad to the right via the connection path 36' of FIG. 3 prior to the fracturing of die as illustrated in FIG. 6.

FIG. 6 illustrates the device of FIG. 5 after the fracture line has been stressed to the point of breaking so that the edges 71 and 73 are produced on the die BE of FIG. 3. Similar straight fracture surfaces would be produced from the grooves 40 and 42.

Figure 7:
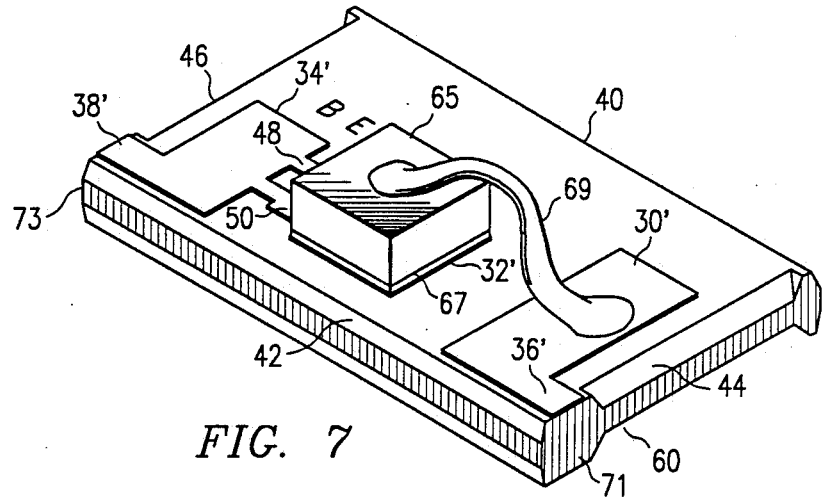
FIG. 7 is an isometric view of an individual die ready for final assembly into a product.

The completed die is shown in FIG. 7 where it is clear that the connection paths 36' and 38' have been broken during the fracturing process.

OPERATION

The definition of the circuitry on the wafer can be done in many different ways for different applications of the concept, and further, the manner in which the grooves can be etched into the surface for the fracturing process to have the precise registration required can be accomplished in many forms. The process used to provide one embodiment of the invention will be given as an example implementation of the concept.

The wafer 12 as received, typically does not have an oxide layer but does have the cut 15 which defines or is representative of or is parallel with a given crystalline axis. This cut or edge 15 is used as a reference point from which the photolithographic processes are aligned.

After the wafer is oxidized, a photoresist is used to cover the oxidized wafer and the pattern illustrated in FIGS. 1 and 2 is provided and the material is processed to leave the metallic pattern on the wafer. For reasons of obtaining a good adhesive of the metallic layer to the oxide and for purposes of providing a good adhesion to the solder, three layers of metal are deposited comprising titanium, platinum and gold. The old photoresist layer is then removed and a new layer is applied and it is exposed for the grooves using the same reference as previously utilized. The pattern for the grooves is then processed and etchant material is used to etch out the crystalline semiconductor material 12 of wafer 10 to produce grooves such as 40, 42, 44 and 46 on one side of the wafer and the material of grooves 60 and 62 on the opposite side where the vertices of the grooves follow the <110> crystallographic planes of the substrate semiconductor material 12. The pattern can then be removed and a new photolithographic process or pattern can be used to put solder on the various laser pads such as 32 and 32' throughout the wafer pattern. The solder such as solder pad 67 of FIG. 5 is then used in a solder reflow and surface tension technique to attach and precisely self-align the laser diodes such as laser diode 65 to the pad 32'. While a given conductor cross-section or width is needed for the connective path between laser pad 32 and the bond pad 34, the wicking action of the solder is such that it is desirable to break this connection up into two separate smaller width connective paths such as 48 and 50 of FIG. 3. A wire bonding machine can then be used to produce a ball bond on the wire 69 at the end attached to laser diode 65 and a stitch bond where it is connected to the bond pad 30. All of the above steps can be produced using the same alignment procedures and thus all of the parts of the array and of the specific die within the array are very exactly and accurately positioned. The contact pads such as 24 and 26 allow the use of a given set of contacts to place a voltage across the series connection of a row of laser diode chips configured as illustrated in FIG. 5 before the connection strips such as 36 and 38 are broken. After a suitable burn-in period, an automatic testing device can be used to place contacts on each of the bond pads such as 30 and 34 to test the operation of each laser diode 65. The testing can be computerized because the positions of all of the diodes and their associated bond pads are known in advance due to the photolithographic registration of all of the parts. Further, with the markings indicating row and column of each of the die, a record can be maintained of which of the die meet specifications and which do not. Thus, after the die are broken into individual units, the chips failing to meet specifications can be discarded before being assembled into a finished product. Due to the size of the chips, the prior art practice has been to assemble the chips into a finished product before testing because it was difficult to handle the chips and perform any testing unless attached to a more stable and substantial base. However, in the array such testing is vastly simplified.

After the burn-in period and the testing, the wafer can be scored along the dash lines such as 16, 18, 20 and 22 to remove all the waste material of the wafer. This leaves only the center array which can then easily be broken along the fracture lines set up by the etched grooves.

As previously mentioned, it is highly desirable that the grooves not make connections one to the other since this will tend to produce rounded corners. While the rounded corners do not in and of themselves cause problems, the rounded corners tend to cause the fracture to be less straight than occurs when the grooves are designed as shown. The "bumps" that tend to occur on one of the two die in the surfaces 71 and 73 from the non-planar fracture then causes alignment problems when automatic equipment is being used to align the chips with respect to their edges if the design of the aligning machine is such that it expects the fracture facet edges to be uniformly smooth. The pads 30' and 34' are of a size sufficient for making electrical connections to the package leads, after the laser-heat sink assembly is mounted in a package.

Although we have described a preferred embodiment of the inventive concept, it is to be realized that many modifications of the present inventive product shown may be made and still fall within the inventive concept. As an example, although the diode is attached to the heat sink, comprising in part the substrate 12, using a solder reflow technique to accurately align same, future techniques can include the epitaxial growth of the laser diode in the appropriate portion of the heat sink chip. Further, while the laser diode illustrated has one contact on one side and the other contact on the opposite side, laser diodes can be obtained which have both contacts on the same side and thus the metallization pattern could be redesigned to accommodate such a laser diode and eliminate the somewhat time consuming process of attaching the wire bond lead such as 69.

Other improvements and alterations will be apparent to those skilled in the art and thus, we wish to be limited only to the concepts of etching fracture inducing grooves for defining chips, performing testing and burn-in of chip products while still situated in an array on a wafer, and any of the other concepts and products as defined in the attached claims wherein we claim:

1. A solid-state wafer suitable for dicing after burn-in and testing of the chips on said wafer comprising, in combination:
    wafer semiconductor substrate means having <100> orientated opposing sides;
    a plurality of first V-grooves extending across the opposing sides of said substrate means, precisely aligned with one another, forming a grid of parallel lines on each side and having the vertices thereof following the <110> crystallographic planes of the substrate means;
    a plurality of sets of non-interconnecting etched second V-grooves having the vertices thereof following the <110> crystallographic planes of the substrate means and extending across the opposing sides of said substrate means where each set of second V-grooves defines a dash line extending substantially across said wafer means orthogonal said first V-grooves to define a plurality of die;
    an electrical solder pad on each defined die;
    active electrical device means attached to said solder pads; and
    electrical connection means, connecting solder pads of adjacent die through the areas between said etched V-groove areas in a series electrical connection to facilitate burn-in of said active electrical device means, the dicing process resulting in breakage of said electrical connection means in the vicinity of the sets of etched V-groove areas defining broken lines.

2. A solid-state wafer suitable for dicing after burn-in and testing of any components on individual die of said wafer comprising, in combination:
    wafer semiconductor substrate means having <100> orientated opposing sides;
    a plurality of first V-grooves extending across the opposing sides of said substrate means, precisely aligned with one another, forming a grid of parallel lines on each side and having the vertices thereof following the <110> crystallographic planes of the substrate means where the parallel lines define fracture lines of the wafer; and
    a plurality of sets of separated etched second V-grooves having the vertices thereof following the <110> crystallographic planes of the substrate means and extending across the opposing sides of said substrate means where each set of second V-grooves intermittently defines a further fracture line extending substantially across said wafer means orthogonal said first V-grooves to define a plurality of die, the sets of second V-grooves stopping short of connecting with said first V-grooves.

3. A solid-state substrate suitable for dicing after burn-in and testing of the chips on said wafer comprising, in combination:
    semiconductor substrate means having a <100> orientated surface;
    a first plurality of V-grooves extending across the surface of said substrate means and defining a first set of fracture lines, precisely aligned with one another, forming a grid of parallel lines and having the vertices thereof following the <110> crystallographic planes of the substrate means;
    a second plurality of sets of separate etched V-grooves having the vertices thereof following the <110> crystallographic planes of the substrate means and extending said substrate means where said second plurality of etched V-grooves define a second plurality of fracture lines extending substantially across said substrate means, orthogonal said first fracture lines to define a plurality of die;
    an electrical solder pad on each defined die;
    active electrical device means attached to said solder pads; and
    electrical connection means, connecting solder pads of adjacent die through areas between said etched V-groove in a series electrical connection to facilitate simultaneous burn-in of said active electrical device means, the dicing process resulting in breakage of said electrical connection means in the vicinity of the fracture lines.

4. The method of facilitating testing of an array of laser diode devices comprising the steps of:
    defining a plurality of V-grooves having the vertices thereof following the <110> crystallographic planes of a substrate means on opposing sides of the substrate means, said V-grooves acting to define fracture lines precisely aligned with one another, forming a grid of rectangular die on said substrate;
    defining at least one active device area in each rectangular die precisely dimensioned relative the fracture lines;

electrically connecting an active device associated with each active device area with an adjacent active device to provide a series connection; and applying a voltage across the series connection of active devices to provide burn-in testing of the active devices before fracture-type separation for production of separate devices.

5. The method of facilitating testing of an array of laser diode devices comprising the steps of:

generating a plurality of sets of discontinuous V-grooves extending across the opposing sides of a substate means, precisely aligned with one another, forming a grid of rectangular die on each side and having the vertices thereof following the <110> crystallographic planes of the substrate means;

generating at least one active device area in each rectangular die precisely dimensioned relative the sets of V-grooves;

automatically testing the characteristics of each active device associated with each active device area and storing the results of said testing; and breaking the tested array into separate device chips and marking same as a function of the tested results for later assembly into piece parts.

6. A solid-state wafer suitable for dicing after burn-in and testing of electronics comprising part of chips on said wafer comprising, in combination:

wafer semiconductor substrate means having a crystalline <100> orientated surface;

a plurality of etched first V-grooves defining first fracture lines which first fracture lines extend across the surface of said substate means and are precisely aligned with one another, forming a grid of parallel fracture lines and having the vertices thereof following the <110> crystallographic planes of the substrate means;

a plurality of sets of separated etched second V-grooves having the vertices thereof following the <110> crystallographic planes of the substrate means and the second V-grooves defining second fracture lines which second fracture lines extend across said substrate means orthogonal said first fracture lines to define a plurality of die;

active electrical device means attached to defined die; and electrical connection means, interconnecting active electrical devices on adjacent die to facilitate simultaneous burn-in of said active electrical device means, the dicing process resulting in breakage of said electrical connection means in the vicinity of the fracture lines.

7. A solid-state wafer suitable for dicing after testing of electronics comprising part of chips on said wafer comprising, in combination:

wafer semiconductor substrate means having a crystalline <100> orientated surface;

a plurality of etched first V-grooves defining first fracture lines which first fracture lines extend across the surface of said substate means and are precisely aligned with one another, forming a grid of parallel fracture lines and having the vertices thereof following the <110> crystallographic planes of the substrate means;

a plurality of sets of separated etched second V-grooves having the vertices thereof following the <110> crystallographic planes of the substrate means and the second V-grooves defining second fracture lines which second fracture lines extend across said substate means orthogonal said first fracture lines to define a plurality of die;

active electrical device means attached to defined die; and electrical connection means, interconnecting active electrical devices on adjacent die to facilitate simultaneous burn-in of said active electrical device means, the dicing process resulting in breakage of said electrical connection means in the vicinity of the fracture lines.

* * * * *